United States Patent [19]

Chen

[11] Patent Number: 4,707,219

[45] Date of Patent: Nov. 17, 1987

[54] INTEGRATED DEVICES INCLUDING CLEAVED SEMICONDUCTOR LASERS

[75] Inventor: Chung Y. Chen, New Providence, N.J.

[73] Assignee: American Telephone and Telegraph Company, AT&T Bell Laboratories, Murray Hill, N.J.

[21] Appl. No.: 733,868

[22] Filed: May 14, 1985

[51] Int. Cl.$^4$ .................. H01L 21/306; B44C 1/22; C03C 15/00; C03C 25/06
[52] U.S. Cl. .................. 156/644; 156/645; 156/655; 156/659.1; 156/662; 357/17; 357/30; 372/50; 437/225
[58] Field of Search .......... 29/569 L, 572, 580; 357/17, 29, 30; 372/43, 44, 48, 50; 156/644, 645, 655, 659.1, 662; 148/1.5, 175

[56] References Cited

U.S. PATENT DOCUMENTS

| 3,341,937 | 9/1967 | Dill .................. 29/569 L |
| 3,457,633 | 7/1969 | Marinace et al. .......... 29/569 L |
| 4,354,898 | 10/1982 | Coldren et al. .......... 29/569 L |

OTHER PUBLICATIONS

*Applied Physics Letters*, 41, 1982, p. 126.
*IEEE Journal of Lightwave Technology*, LT-1, 1983, p. 261.

Primary Examiner—William A. Powell
Attorney, Agent, or Firm—Richard D. Laumann

[57] ABSTRACT

A new technique called stop cleaving permits semiconductor lasers having etched mirrors to be fabricated on a common substrate with other optical or electronic components such as photodetectors and field-effect transistors.

2 Claims, 5 Drawing Figures

INTEGRATED DEVICES INCLUDING CLEAVED SEMICONDUCTOR LASERS

TECHNICAL FIELD

This invention relates generally to the field of optoelectronic integration and particularly to such monolithic optoelectronic integration which includes devices, such as lasers, having cleaved facets.

BACKGROUND OF THE INVENTION

Semiconductor light sources, such as lasers and photodetectors have many applications in modern technology including telecommunications. For many, if not most, applications, it is desirable to have a structure which combines the optical functions performed by the laser or photodetector with the electronic functions performed by, for example, field-effect transistors (FET). In other words, it would be desirable to have a structure that performs the optical and electronic functions on a single substrate. This type of structure yields what is generally referred to as monolithic optoelectronic integration. Such a device structure has a number of possible advantages associated with lower cost: simplier, more rapid processing; better electrical connection; avoidance in dealing with a plurality of semiconductor chips; etc.

There have been attempts to fabricate monolithic integrated optoelectronic circuits combining, for example, a laser with a field-effect transistor. See, for example, *Applied Physics Letters* 41, p. 126, 1982. Additionally, a laser, field-effect transistor and photodiode have been fabricated to form an optical repeater. Furthermore, lasers have been integrated with electronic circuits containing several FETs to form differential amplifiers. See, for example, *IEEE Journal of Lightwave Technology*, LT-1, p. 261, 1983.

None of the approaches used in implementing these circuits has yielded completely satisfactory results. The length of the semiconductor laser active area, i.e., the cavity, is generally approximately 300 μm or less. If the skilled artisan wishes to provide cleaved laser facets, the chip must be cleaved to form both ends of the cavity thereby limiting the area available for the electronic devices to a length less than approximately 300 μm although the width may be large.

Several approaches have been taken in attempting to avoid the relatively stringent space limitation imposed by this technique. One approach uses chemical etching, either wet or dry, to fabricate etched mirrors for the laser. This permits a large area to be available for the electronic devices. However, at the present time, etched mirror lasers do not achieve performances which are as good as lasers having cleaved facets.

Another approach involves what is termed microcleaving in an attempt to obtain better quality laser mirrors. A portion of the active layer is undercut to form a free standing member. Ultrasonic vibration is then used to produce a cleave in the member. However, this technique suffers the drawback of having the laser cavity lengths randomly determined, within a range, by the vibration. It suffers the additional practical drawback of not having obtained high yields of good quality facets.

SUMMARY OF THE INVENTION

Devices, such as lasers, having cleaved mirrors may be expediently fabricated on a common substrate with other optoelectronic components by etching, for example, a hole in the substrate and then cleaving between the hole and a first substrate edge. The hole and the first substrate have to be connected by another edge surface which may be a wafer edge or the edge of a hole formed by etching. The mirror or facet so formed is termed a stop cleaved facet. The hole prevents propagation of the cleave along the entire substrate. This technique may be used to fabricate both mirrors in a laser cavity or one laser mirror may be formed by conventional cleaving techniques. The resulting laser may be monolithically integrated with other optoelectronic devices, such as field-effect transistors, or photodetectors acting as a monitor for the laser, etc., fabricated on a common substrate.

DETAILED DESCRIPTION

Figure 1:
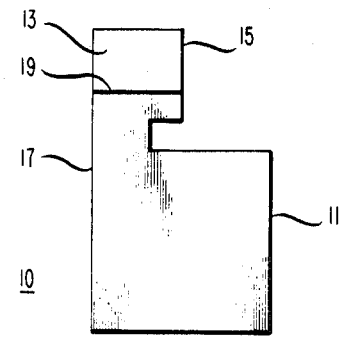
FIG. 1 is a top view of a laser having one stop cleaved facet.

FIG. 1 is a top view of a structure 10 having a laser with a single stop cleaved facet. Depicted is a semiconductor surface 11 having a laser 13. There will, in general, be a plurality of epitaxial layers in the laser and underneath the surface. All layers are grown on a single substrate. However, the layers need not be the same as selective etching may be used to remove some layers on portions of the substrate as shown.

The laser has a stop cleaved facet indicated as 15. It also has a conventional cleaved facet indicated as 17 which runs along the entire length of one side of the substrate. The active stripe is depicted as 19 on the surface 1. Semiconductor surface 11 may be used for other devices such as an FET, a photodetector, etc.

Figure 2:
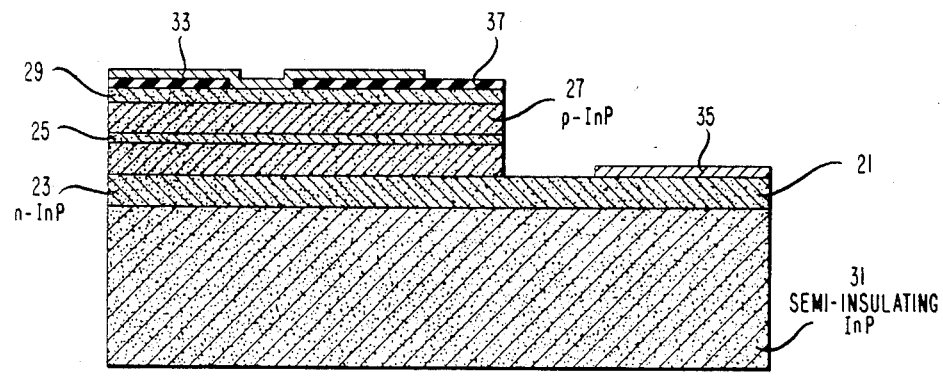
FIG. 2 is a side view showing the structure of a stripe geometry laser prepared by stop cleaving.

FIG. 2 is a side view showing the structure of a stripe geometry laser fabricated with stop cleaving. The structure includes an n+ InGaAsP contact layer 21 approximately 1 μm thick, an n-type InP cladding layer 23 approximately 1.5 μm thick, an undoped InGaAsP active layer 25 approximately 0.2 μm thick, a p-type InP cladding layer 27 approximately 1.5 μm thick and a p+ InGaAsP contact layer 29 approximately 0.5 μm thick. The epitaxial layers are on a semi-insulating InP substrate 31. The p- and n-type metallizations are shown as 33 and 35, respectively. Insulator layer 37 has an opening on which metallization 33 is deposited to define the strip. The p- and n-type contact metallizations are performed with conventional lithographic lift-off procedures. The strip width was chosen to be approximately 5 μm. An expedient choice for the insulator is $Si_3N_4$.

The depicted structure is expediently formed by the following technique. The desired epitaxial layers are grown by conventional and well known techniques on the substrate. In one embodiment, the layers and substrate comprise semiconductors selected from the group consisting of Group III-V and Group II-VI semiconductors. The cleaving is better understood by reference to FIG. 3. One facet is then formed by conventional cleaving so that the cleavage plane extends along the entire length of chip while the other mirror is formed by stop cleaving. At the present time, it is believed that a single stop cleaved facet laser is preferably to a two stop cleaved facet laser as it is more convenient from a practical point of view because it is easier to couple the light out of the laser when the laser is located at a chip corner.

Stop cleaving is expediently performed after all of the steps required to fabricate the individual optoelectronic devices are performed. This includes photolithography, contact metallization, etc. Holes are typically formed on the substrate by etching which may be either wet or dry. The hole is desirably rectangular in shape to minimize loss of surface area. A typical dimension is 75 $\mu m \times 550$ $\mu m$. The holes are aligned parallel to the laser active area, i.e., the longer edges of the hole are oriented parallel to the active area, and the distance between two neighboring holes is approximately 200 $\mu m$. This distance determines the cavity length and may be varied depending upon the desired cavity length. The hole may be etched through the substrate. Alternatively, the hole may be etched partially through the substrate and then completed by lapping the substrate.

The substrate containing the hole or holes is now cleaved into individual chips. This cleaving step forms one laser mirror and the cleavage plane on the chip side opposite the mirror. The second mirror is now formed using conventional cleaving techniques. However, the cleavage line does not propagate along the entire chip but is stopped by the hole.

The cleaving technique is useful with other materials and, of course, the layer thicknesses as well as the laser structure may be varied. Other materials include other Group III-V and Group II-VI compound semiconductors as well as other insulator materials.

The sizes and shapes of the holes are not critical. However, they must be of a size and have a location so that the desired stop cleave will be stopped by a hole. As mentioned previously, rectangular holes will minimize loss of chip surface area. Variations will be readily thought of by those skilled in the art. For example, forming two holes whose closest spacing is less than the desired chip width, enables lasers having two stop cleaved facets to be fabricated. It will also be appreciated that more than one laser may be fabricated on a chip. It will also be appreciated that devices other than lasers may be fabricated with cleaved facets.

Figure 3:
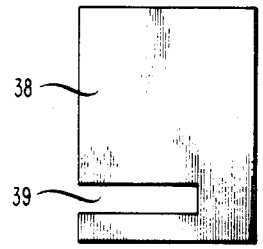
FIG. 3 is a view of a substrate useful in describing the stop cleaving procedure.

FIG. 3 shows a typical shape for a substrate 38 before carrying out the stop-cleave operation. The Figure shows the hole 39 used to stop the cleave so as to retain part of the substrate for other devices. More extensive substrate shapes may be used to obtain more devices.

The stop cleave technique is well suited to monolithic optoelectronic integration for several reasons. First, the technique is compatible with conventional cleaving procedures and the results are relatively high-yield. Second, the cavity length of the laser can be controlled very accurately and one may also cleave very short cavities. Third, the lasers may be located anywhere along the edge of the chip. Fourth, the technique is compatible with any type of semiconductor device and does not depend critically upon a precise choice of materials. The only additional step required to fabricate devices according to this invention is an etching following the device fabrication.

Figure 4:
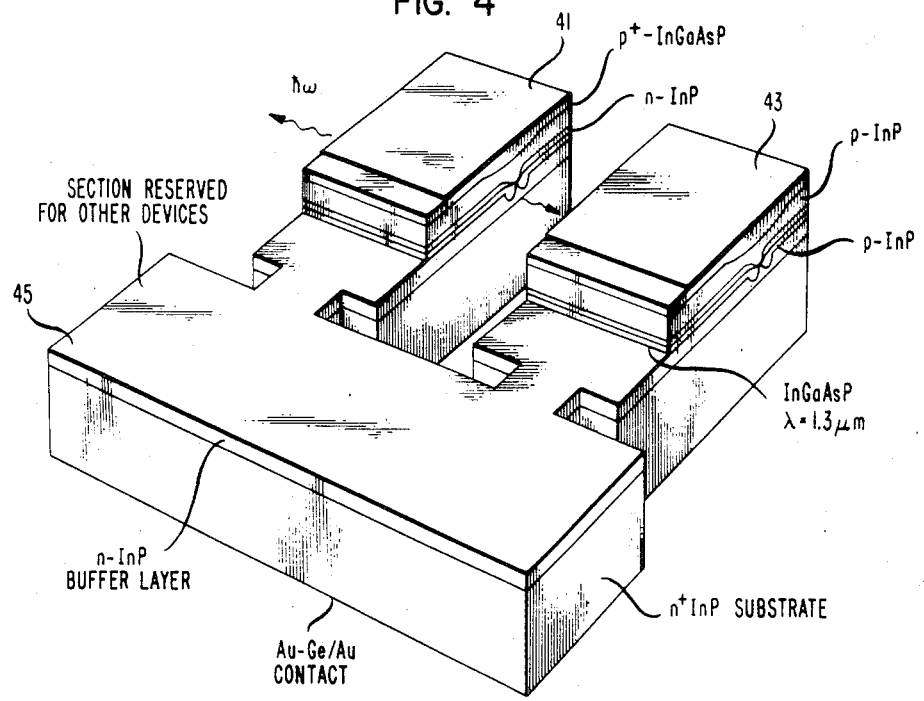
FIG. 4 is a perspective view of an integrated laser and detector structure.

An integrated laser-detector structure is depicted in FIG. 4. Depicted in FIG. 4 are a laser 41, a detector 43, and semiconductor surface 45. The latter surface is useful for other devices such as field-effect transistors. Fabrication proceeds by etching grooves on the substrate which become holes after the substrate is thinned. The facets of the laser and detector should be separated physically prior to stop cleaving although both devices remain attached to a common substrate. The laser is prepared by stop cleaving both facets although a similar procedure is not required for the detector. It is noted that ohmic separation between the devices is accomplished by locally etching the p+ quaternory capped layer, and the underlying layers. Thus, the n+ InP layer serves as a common ground for both devices.

Figure 5:
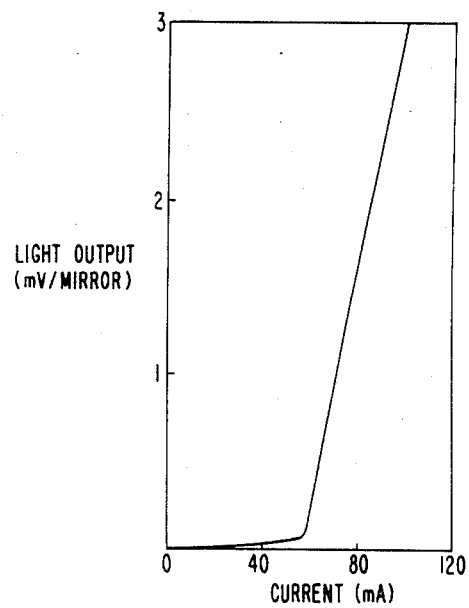
FIG. 5 plots the light output vertically in mW/mirror versus the current horizontally in units of mA for a stop cleaved laser.

The light versus current characteristics of a laser, such as depicted in FIG. 4, emitting at 1.3 $\mu m$ under pulsed operation is depicted in FIG. 5. The laser had a threshold current of 57 mA and a differential quantum efficiency of 17%. The spacing between the laser and the detector facets was approximately 200 $\mu m$.

What is claimed is:

1. A process for fabricating a semiconductor device comprising semiconductor laser on a semiconductor substrate in which prior to cleaving the semiconductor substrate to form a facet of the semiconductor laser a hole is made in the substrate along the cleave plane so as to produce a stop cleave facet.

2. The process of claim 1 in which the hole is produced by wet or dry etching.

* * * * *